(12) United States Patent
Yap et al.

(10) Patent No.: US 11,108,211 B1
(45) Date of Patent: Aug. 31, 2021

(54) OPTICAL INJECTION-LOCKED LASER

(71) Applicant: HRL Laboratories, LLC, Malibu, CA (US)

(72) Inventors: Daniel Yap, Newbury Park, CA (US); Monica Minden, Calabasas, CA (US)

(73) Assignee: HRL Laboratories, LLC, Malibu, CA (US)

(*) Notice: Subject to any disclaimer, the term of this patent is extended or adjusted under 35 U.S.C. 154(b) by 692 days.

(21) Appl. No.: 14/033,877

(22) Filed: Sep. 23, 2013

Related U.S. Application Data

(62) Division of application No. 13/045,072, filed on Mar. 10, 2011, now Pat. No. 8,569,675.

(51) Int. Cl.
  *G01J 1/00* (2006.01)
  *H01S 5/04* (2006.01)

(52) U.S. Cl.
  CPC ................................ *H01S 5/041* (2013.01)

(58) Field of Classification Search
  CPC . H01S 5/041; H01S 3/10038; H04B 10/2914; G01B 9/02004; G02F 1/0121
  USPC .......................... 250/227.18, 227.19, 227.23
  See application file for complete search history.

(56) References Cited

U.S. PATENT DOCUMENTS

| | | | | |
|---|---|---|---|---|
| 9,702,687 | B2* | 7/2017 | Schmitt | G01B 9/02091 |
| 2005/0169324 | A1* | 8/2005 | Ilday | H01S 3/06708 |
| | | | | 372/18 |
| 2005/0185681 | A1* | 8/2005 | Ilchenko | H01S 5/146 |
| | | | | 372/20 |
| 2006/0187537 | A1* | 8/2006 | Huber | G01B 9/02091 |
| | | | | 359/337.22 |
| 2007/0153289 | A1* | 7/2007 | Yilmaz | G01C 19/72 |
| | | | | 356/464 |
| 2011/0292486 | A1* | 12/2011 | Delfyett | G02F 1/0121 |
| | | | | 359/260 |
| 2012/0327961 | A1* | 12/2012 | Poon | H01S 3/10038 |
| | | | | 372/26 |
| 2014/0078579 | A1* | 3/2014 | Yoshida | H04B 10/2914 |
| | | | | 359/333 |
| 2014/0085639 | A1* | 3/2014 | Johnson | G01B 9/02004 |
| | | | | 356/479 |
| 2014/0270786 | A1* | 9/2014 | Poddar | H04B 10/61 |
| | | | | 398/116 |

* cited by examiner

*Primary Examiner* — Georgia Y Epps
(74) *Attorney, Agent, or Firm* — HRL Laboratories, LLC; George R. Rapacki

(57) ABSTRACT

The invention is a Demodulator for an Optical Analog Pulse Position Modulated signal suitable for inclusion in receivers for Free Space Optical communication systems. In one embodiment the Demodulator may use the pulse position modulated optical information signal and the clock signal with different wavelengths. By proper biasing of a Semiconductor Optical Amplifier and selection of wavelengths for the information signal and the clock signal, the performance of the Demodulator is made insensitive to noise in the received signals.

4 Claims, 13 Drawing Sheets

OPTICAL INJECTION-LOCKED LASER

This application is a divisional application of, and claims priority to, Ser. No. 13/045,072 filed Mar. 10, 2011 titled Optical Analog PPM Demodulator.

STATEMENT REGARDING FEDERALLY SPONSORED RESEARCH OR DEVELOPMENT

This invention was made with Government support under Contract No. -05-C-0044 Optical Analog Pulse Position Modulation System. The Government has certain rights in this invention.

FIELD OF THE INVENTION

The invention relates to the structure and fabrication of optical analog demodulators for pulse position modulated signals.

BACKGROUND OF THE INVENTION

Most Free Space Optical (FSO) links make use of intensity modulation or amplitude modulation of the laser light. However, the signal-to-noise ratio (SNR) of an intensity modulated optical link is limited by the shot noise in the number of photons collected at the receiver. Pulse-position modulation (PPM) can provide a means to achieve a link in which the signal-to-noise ratio can exceed the limits of shot noise. Thus, the transmitted power can be reduced, the distance of the link can be increased, the sizes of the transmitter and receiver apertures can be reduced, and the link performance can be more tolerant to the variable attenuation arising from atmospheric turbulence. Optical PPM links have been developed for transmission of digital information in long-distance or high-loss non-waveguided optical links such as deep-space links. These optical links have been demonstrated with discrete-level modulation using pulse-position modulation transmitters and photon-counting receivers that have as many as 256 levels of position modulation or 256 time slots [S. S. Muhammad, P. Brandl, E. Leitgeb, O. Koudelka and I. Jelovcan, "VHDL based FPGA Implementation of 256-ary PPM for free space optical links," Proc. $9^{th}$ Intl. Conf. Transparent Optical Networks, 2007, pp. 174-177]. Decoding the received signal typically involves detection and discernment of the presence of optical energy in the various time slots. The SNR demands for a receiver for continuous-level, analog optical PPM systems are much more stringent.

An alternative modulation scheme for an optical link uses optical analog pulse-position modulation (OAPPM) that transmit pairs of short optical pulses through free space, with the relative time-positions of, or the time-delay between, those two pulses in a pair being proportional to the time-sampled analog value of an input RF signal. As noted before, conventional optical receivers of optical links that carry intensity modulated light with direct detection of that light by a photo-detector have an output SNR that is no greater than the intensity to noise ratio of their input light. A Demodulator in an OAPPM system converts the relative time-positions of pairs of input optical pulses into an analog output voltage or current. One pulse of the pair, generally the signal pulse, has its time-position modulated and the other pulse of the pair, generally the clock reference pulse, has a fixed time position. In those cases when it is desired for the FSO link to have a lower transmit power or to cover a longer distance, the optical intensity of the received pulses can be low. Hence, it is important that the Demodulator be tolerant of intensity noise in the input pulses that are received via the free-space optical (FSO) link. Such low-intensity optical pulses may have substantial shot noise, or noise in the number of photons that comprise a pulse. An optical amplifier at the front-end of the OAPPM receiver can increase the optical power of those pulses in a pair, but that amplification process adds even more intensity noise, which could further degrade the performance of optical links that carry analog information.

A prior art OAPPM Demodulator is described in S. I. Ionov, "Method and apparatus for PPM demodulation using a semiconductor optical amplifier," U.S. Pat. Nos. 7,605,974 and 7,330,304B2. The OAPPM Demodulator and functionality in the U.S. Pat. No. 7,330,304 patent is reproduced in FIGS. 1, 2A and 2B of this application. This OAPPM Demodulator accepts pairs of input optical signal and clock pulses 110 and 120, respectively, for which the variable position of one pulse in a pair (the signal pulse 110) is modulated relative to the fixed position of the other pulse in that pair (the clock pulse 120). The OAPPM Demodulator 100 needs to be able to distinguish between, and separate, the signal and clock pulses 110 and 120 of a pair. One of the prior ways to enable this separation is for the two pulses to have different optical wavelengths [see the '304 patent]. The primary component in the OAPPM Demodulator 100 is a semiconductor optical amplifier (SOA) 135 that acts as a pulse-position to pulse-intensity converter [see the '304 patent]. As shown in FIGS. 2A and 2B, one way for the SOA 135 to do this conversion is for each clock pulse 120 to deplete the carrier-population and thus the gain of the SOA 135. The carrier population then recovers gradually after that clock pulse 120 has ended because a continuous flow of carriers are supplied to the SOA 135 by means of the applied bias current. The gain experienced by the following position-modulated signal pulse 110 provides a measure of the amount of gain recovery. Thus, the intensity of the amplified signal pulse 130 is related to the time delay between that signal pulse 110 and the preceding clock pulse 120. Returning to FIG. 1, the amplified clock pulses on the output of the SOA (if any) and the amplified signal pulses 130 that are output from the SOA are separated from each other by an optical filter or demultiplexer 131 in FIG. 1. If necessary, an optical bandpass filter 137 may be used to further block the clock pulse 120. These intensity modulated signal pulses 130 are then coupled to a photodetector 140 that has a low-pass frequency response, for producing the output RF waveform while removing the aliasing spurs that are caused by the discrete-time sampling process associated with analog pulse-position modulation.

Continuing with FIG. 1, the prior OAPPM Demodulator 100 makes use of an SOA 135 as a pulse-position to pulse-intensity converter, as does the SOA of the present disclosure. However, the prior OAPPM Demodulator 100 assumes that there is a near-perfect optical limiter before the SOA 135 that removes any intensity noise in the signal and clock pulses coupled into the SOA 135. Such a near-perfect optical limiter has not been developed. Moreover, the prior OAPPM Demodulator 100 in FIG. 1 only requires that the wavelength of the signal pulse 110 and of the clock pulse 120 be different so that those two pulses can be separated. There is no requirement of any relationship between the wavelengths of the signal pulse 110 and clock pulses 120 to the gain characteristics of the SOA 135. There also is no requirement on the temporal shape of the signal pulse 110 and clock pulse 120 coupled into the SOA 135. The prior OAPPM Demodulator 100 could have a balanced pair of photodiodes comprise the photodetector 140 instead of a single photodiode. The prior art photodetector 140 with balanced photodiodes have the clock pulses 120 and the signal pulses 110 coupled, respectively, into their two optical inputs.

In the prior OAPPM Demodulator 100, the optical pulse that samples the recovering gain of the SOA 135 (the signal pulse 110) would have an intensity that depends both on the intensity of the input sampling signal pulse 110 as well as on the gain of the SOA 135 at the time of that signal pulse 110. However, because a near-perfect optical limiter is not available, the intensity of the input sampling signal pulses 110 would have substantial variations. Also, since the wavelength of the gain depleting clock pulses 120 could be longer than the wavelength of the gain sampling signal pulses 110, it actually would not be possible for those gain depleting clock pulses 120 to deplete the gain of the SOA 135 to a fixed point. Instead the depleted gain level of the SOA 135 would depend on the varying intensity of the gain-depleting clock pulse 120. As a result, the starting point for the gain recovery would fluctuate because of the noisy intensity of the gain-depleting clock pulse 120. This would transfer the intensity noise of the gain-depleting clock pulse 120 onto the modulated intensity of the gain-sampling signal pulse 110. But to achieve a desired high SNR performance, it is important the demodulation process be independent of fluctuations in the intensity of the gain-depleting clock pulses 120.

SUMMARY OF THE INVENTION

In one aspect of the invention, the Demodulator has features that make it tolerant of the intensity noise of both its input signal pulses and its input clock-reference pulses. In another aspect of the invention the Demodulator also has features that may make it tolerant of absolute timing noise or jitter in those signal pulses and clock pulses. The Demodulator contains and uses a semiconductor optical amplifier (SOA) as a pulse-position to pulse-intensity converter. The Demodulator is part of an OAPPM receiver that also contains an optical amplifier that amplifies the intensity of the pairs of signal and clock-reference pulses that it receives. These amplified signal pulses are coupled to the SOA and they act to briefly deplete the gain of the SOA, by stimulating emission of light by the SOA. Contrary to the prior art, the signal pulses are used to reset the SOA gain while the clock pulses are used to sample the gain.

The Demodulator may also contain an optical injection-locked short-pulse laser that generates sampling pulses, which may be called the clock pulses. These clock pulses have low intensity-noise and are synchronized to the received clock-reference pulses. In effect, the optical injection-locked short-pulse laser normalizes the received clock-reference pulses. The clock pulses from the short-pulse laser are coupled to the SOA, and act to sample the gain of the SOA because the amplification of the clock pulse depends on the gain of the SOA at the time the clock pulse is passing through the SOA. Thus, the intensity of these amplified clock pulses is modulated according to the sampled gain of the SOA. The sampled gain is dependent on the time between the clock pulse relative to a prior gain depleting pulse.

The level of the bias current supplied to the SOA, the wavelengths of both the clock pulses and the signal pulses and the gain characteristics of the SOA are selected to achieve a resetting of the gain of the SOA by each received signal pulse. This resetting is accomplished by having the SOA reach the transparency condition when the signal pulse is coupled into the SOA. The Demodulator may also contain another optical amplifier for increasing the intensity of the signal pulses to ensure the SOA achieves transparency.

The Demodulator may contain an optical pulse replicator of the received signal pulses that converts the received signal pulses into a wide effective pulse with steep rising and falling edges of a single signal pulse. A wide effective pulse is realized as a plurality of multiple narrow signal pulses. An alternative embodiment may comprise a variation of the optical pulse replicator that has an optical wavelength-selecting splitter and an optical wavelength-selective combiner.

The Demodulator may also contain a photodetector that converts the series of amplified and intensity-modulated clock pulses to an output electrical voltage or current. Another embodiment of the invention contains a balanced photodetector pair instead of a single photodetector. The amplified clock pulses, obtained from the output of the SOA, are coupled into one of the two optical inputs of this balanced photodetector pair and the original clock pulses produced by the short-pulse laser are coupled into the other input of this balanced photodetector pair.

BRIEF DESCRIPTION OF THE DRAWINGS

The accompanying drawings, together with the specification, illustrate exemplary embodiments of the invention, and, together with the description, serve to explain the principles of the invention.

DETAILED DESCRIPTION

Figure 1:
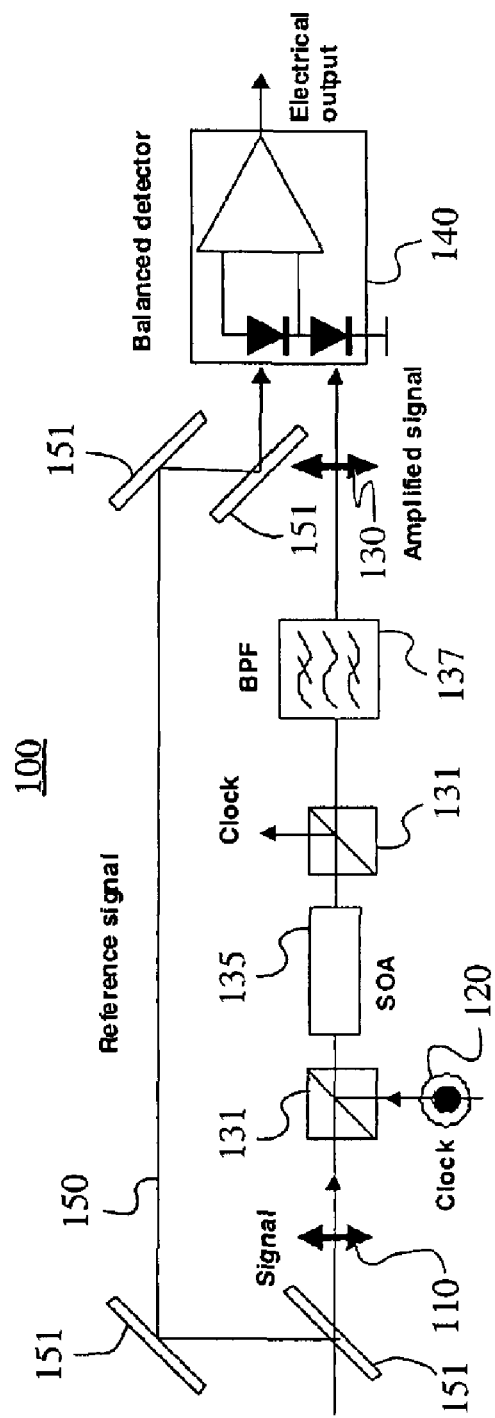
FIG. 1 illustrates the prior art demodulator.
Figure 2A:
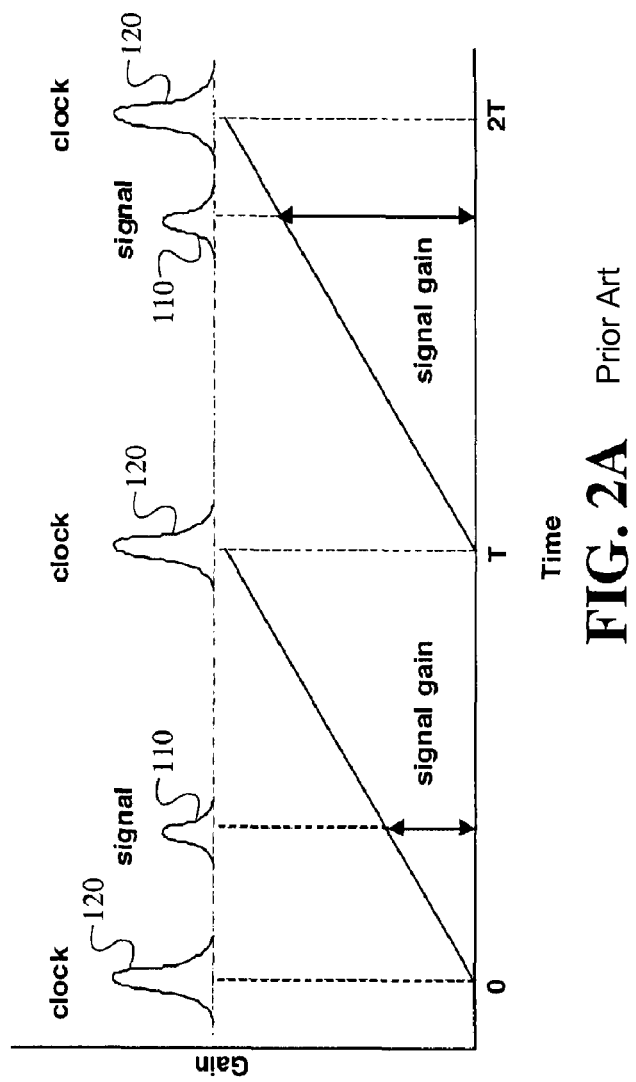
FIGS. 2A and 2B show the operation of the prior art demodulator shown in FIG. 1.
Figure 2B:
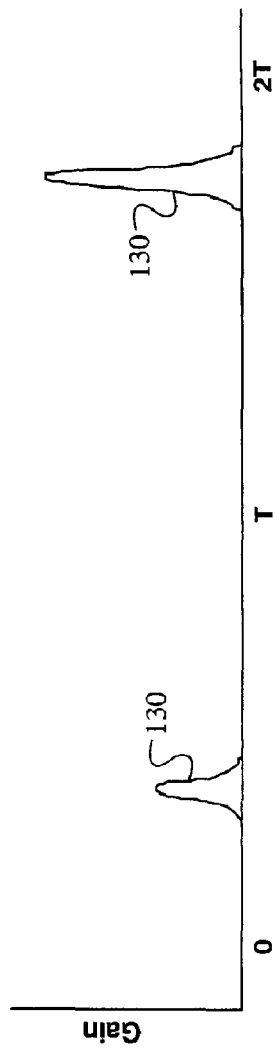

In the following detailed description, only certain exemplary embodiments of the invention are shown and described, by way of illustration. As those skilled in the art would recognize, the described exemplary embodiments may be modified in various ways, all without departing from the spirit or scope of the invention. Accordingly, the drawings and description are to be regarded as illustrative in nature, and not restrictive.

Embodiments of the invention are described herein with reference to block diagram illustrations that are schematic illustrations of idealized embodiments of the invention. It is understood that many of the blocks will have different appearances compared to those shown. Further, variations from the shapes of the illustrations as a result, for example, of manufacturing techniques, tolerances, or particular vendor are expected. Embodiments of the invention should not be construed as limited to the particular embodiments of the components illustrated herein but are to include deviations in components that result, for example, from vendor selection. A component illustrated or described as having particular functionality or performance parameters may be replaced with another component of substantially the same functionality and performance. Thus, the Demodulators illustrated in the figures are schematic in nature and the blocks shown are not intended to illustrate the precise composition of a Demodulator and are not intended to limit the scope of the invention.

The problems previously described are at least partially solved by selecting a Semiconductor Optical Amplifier (SOA) and its operational characteristics such that the bias current and the optical wavelengths of the optical signal and optical clock pulses in a Demodulator minimize the effects of intensity and timing jitter in the signal and clock pulses. Furthermore, the effects of intensity variations and jitter may be attenuated by using a short pulse laser triggered by the clock pulse to sample the SOA gain. This short pulse laser may be considered as normalizing the optical clock pulse input in terms of amplitude, duration and spectral content.

In one aspect of the invention, the signal pulses are used to deplete the gain of the SOA while the received clock pulses are used to sample the gain of the SOA.

In another aspect of the invention the Demodulator preferably sets the position-modulated optical signal pulses to a wavelength that is shorter than the wavelength of the fixed-position optical clock pulses. In addition, the invention may specify the wavelength of those signal pulses to be selected such that the SOA can reach a transparency condition when the signal pulses are coupled into the SOA. In general, the wavelength of transparency is less than or equal to the wavelength of the signal pulse, which is less than or equal to the wavelength of the clock pulse. In an alternative embodiment of the invention, the wavelength of the clock pulses is selected to be on the short-wavelength side of the wavelength for which the gain of the SOA is maximal. In another aspect of the invention, the Demodulator may further include an optical pulse replicator. Furthermore, the Demodulator may include an optical-injection locked short-pulse laser source. In an alternative embodiment of the invention, the Demodulator includes a balanced photodetector pair with two optical inputs such that the clock pulse produced by the laser source may be coupled into one of those inputs and the optical-wavelength filtered, amplified clock pulse output from the SOA, may be coupled into the other of those inputs.

Figure 3:
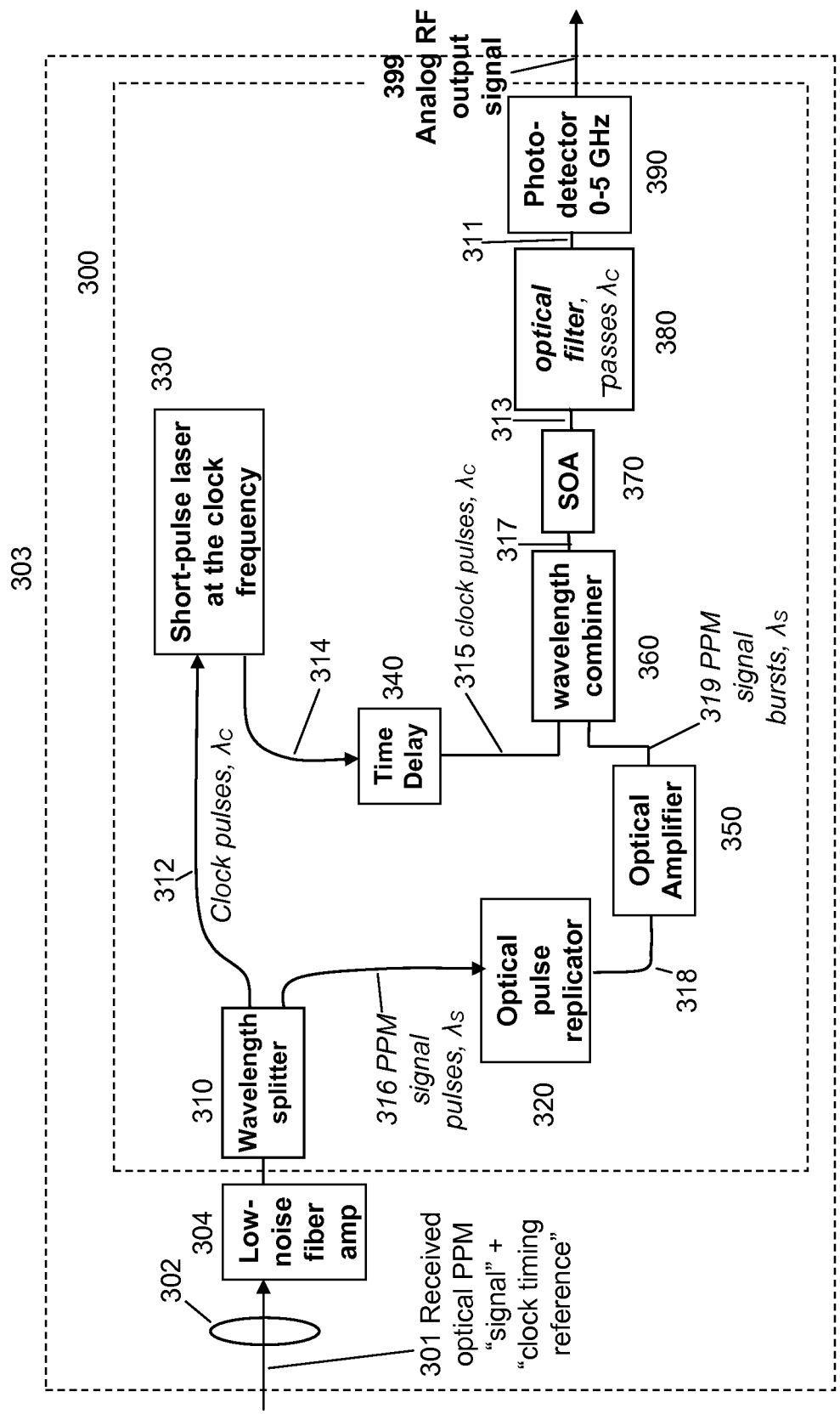
FIG. 3 shows one embodiment of an optical analog pulse position modulation Demodulator of the invention.

One embodiment of the invention of an optical analog pulse-position Demodulator 300 is illustrated in FIG. 3. This Demodulator 300 is part of an OAPPM receiver 303 of an OAPPM link (not shown) that receives pairs of short optical pulses 301. One pulse of the pair 301, the optical signal pulse 316, has its time-position modulated and the other pulse of the pair, the optical clock pulse 312, has a fixed time position. Without implying a limitation, the relative time-positions of, or the time-delay between, those two pulses in a pair 301 is proportional to the time-sampled analog value of an input microwave or RF signal supplied to the OAPPM transmitter (not shown) of that OAPPM link. The function of the Demodulator 300 in an OAPPM system is to convert the relative time-positions of pairs of its input optical pulses 301 into an analog 399 output voltage or current. The OAPPM receiver 303 also may include an optical amplifier 304 that amplifies the received optical signal and optical clock pulses as well as a light-capturing optical aperture 302, such as a telescope. In a preferred embodiment the optical amplifier 304 may comprise a low noise fiber amplifier.

The Demodulator 300 may have less sensitivity to jitter than prior art because: 1) the received optical clock pulses 312 are regenerated by the short pulse generating laser 330, 2) the received optical signal pulse 316 is used to drive the SOA 370 to transparency and finally 3) each optical signal pulse 316 is compared against its particular optical clock pulse 312 rather than comparing the optical signal pulse 316 to a clock derived from a series of clock reference pulses.

Optical clock pulse 312 and optical signal pulse 316 may be generated with different wavelengths by passing the optical clock pulse in the modulator (not shown) through a pulse compressor and then through optical filters to select the desired wavelengths.

The Demodulator 300 in FIG. 3 includes a wavelength splitter 310 that separates the optical clock pulse 312 from the optical signal pulse 316. This is possible because the optical clock pulse 312 and optical signal pulse 316 are at different wavelengths. The optical clock pulse 312 drives a short pulse generating laser 330 which produces a normalized clock pulse 314 at substantially the same wavelength as the optical clock pulse 312 but at a substantially consistent amplitude. The fixed amplitude, fixed duration normalized clock pulses 314 may be delayed by module 340 to allow for adjustment of the timing of the normalized clock pulses 314, producing delayed normalized clock pulse 315. The optical signal pulse 316 in the received pulse pair 301 is selected by the wavelength splitter 310 and drives the optical pulse replicator 320. The optical pulse replicator 320 accepts as input a single optical signal pulse 316 and outputs a plurality of signal pulses 318. The plurality of signal pulses 318 may be amplified by optical amplifier 350 to produce the amplified plurality of signal pulses 319. The amplified plurality of signal pulses 319 are combined with the clock pulse 315 in the wavelength combiner 360. The output 317 of the wavelength combiner 360 is the input to the semiconductor optical amplifier (SOA) 370. The plurality of signal pulses 319 may be considered one pulse with a preferably short rise and fall time. The plurality of signal pulses 319 are energetic enough to ensure the gain of the SOA 370 is fully depleted irrespective of the energy of the optical signal pulse 316. As described later, the input optical signal pulse 316 may be conditioned to maintain the SOA 370 in its transparent state. The delayed normalized clock pulses 315 are then amplified by a gain determined by the SOA 370 bias current (not shown in FIG. 3) supplying carriers to the SOA 370. The output of the SOA 370, amplified clock pulse 313, may be filtered by the optical filter 380 that substantially passes only the delayed normalized clock pulses 315 after amplification by the SOA 370. Any optical energy at the wavelength of the plurality of signal pulses 319 may be blocked by the optical filter 380. The optical filter 380 passes substantially only the wavelength of the normalized clock pulse 314. The output 311 of the optical filter 380 is then the optical clock pulse 312, normalized and amplified by the SOA 370 according to the time separation between the optical signal pulse 316 and optical clock pulse 312 in the received input pulse pair 301. The output 311 is then passed to a photodetector 390 where the optical output 311 is converted to an electrical signal to generate the analog output 399. This analog output 399 is a reproduction of the analog signal used in the transmitter (not shown) to modulate the position of the signal pulses relative to the clock pulses in each pair in input optical pulse, 301.

An alternative embodiment using clock and signal pulses of different polarizations may be realized by replacing the wavelength splitter 310 with one that operates on polarization as in 131 in FIG. 1 and replacing the wavelength filter 380 with one that filters based on polarization as in 131 in FIG. 1. The wavelength combiner 360 may be replaced with a polarization combiner. Components that operate on polarization are commercially available and known to practitioners in the art. The operation of the polarization coupler 131 is described in U.S. Pat. No. 7,605,974 to Ionov, issued Oct. 20, 2009 and incorporated by reference herein.

Figure 4A:
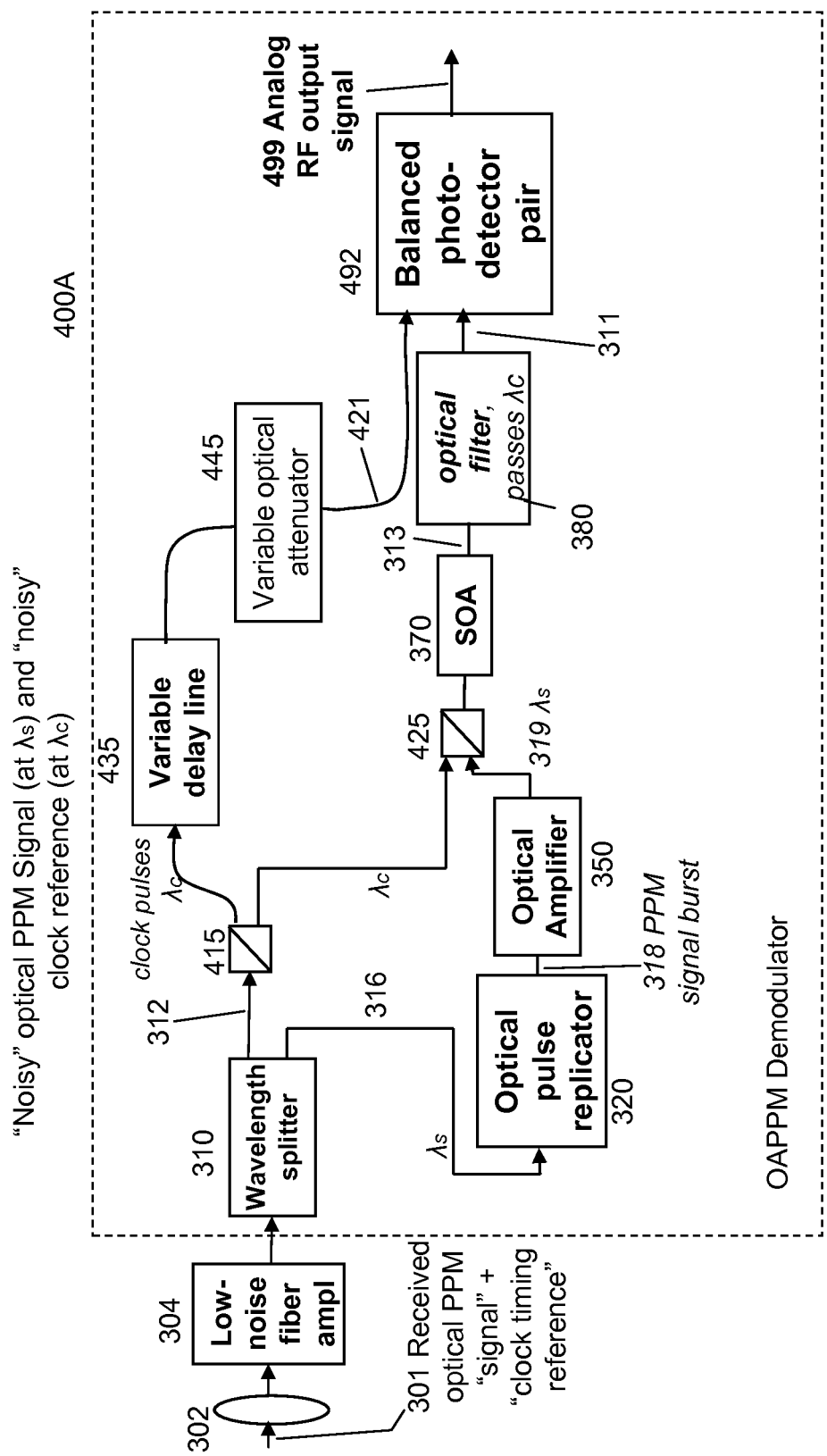
FIG. 4A illustrates an alternative embodiment of an optical analog pulse position modulation Demodulator.

FIG. 4A shows an alternative embodiment 400A of the invention. The components, signals and modules in FIG. 4A that are the same in FIG. 3 have the same reference numbers as in FIG. 3. In the embodiment 400A in FIG. 4A, the short pulse laser 330 is replaced by modules 415, 435 and 445. Module 415 is an optical power splitter, module 435 is an optical variable delay line and module 445 is a variable optical attenuator. In addition, the optical clock pulses 312 drive a balanced photodetector 492. The clock signal 421 from the variable optical attenuator 445 provides a reference level in the balanced photo-detector 492 for comparison against the amplified clock pulse 311 from the SOA 370. This comparison of clock pulses 421 and 311 in the balanced photodetector 492 results in some cancellation of clock noise and spurs. While FIG. 3 uses a wavelength combiner 360 that requires specific wavelengths, FIG. 4A shows an alternate embodiment to combine two light signals of different wavelengths using an optical coupler 425 instead of a wavelength combiner 360.

The remaining components of the Demodulators 300 and 400A are passive wavelength selective components. The optical wavelength splitter 310 separates the input PPM optical signal pulses 316 from the input optical clock pulses 312. An optical filter 380 or optical wavelength selector passes the amplified clock pulses 313 on to the photodetector 390 or 492. A person of ordinary skill in the art may appreciate that these components can be realized using commercially available optical wavelength multiplexers/demultiplexers. An array waveguide grating (AWG) is a preferred way to realize these components because the AWGs fabricated from silica optical waveguides can handle very high levels of optical power without being damaged.

Figure 4B:
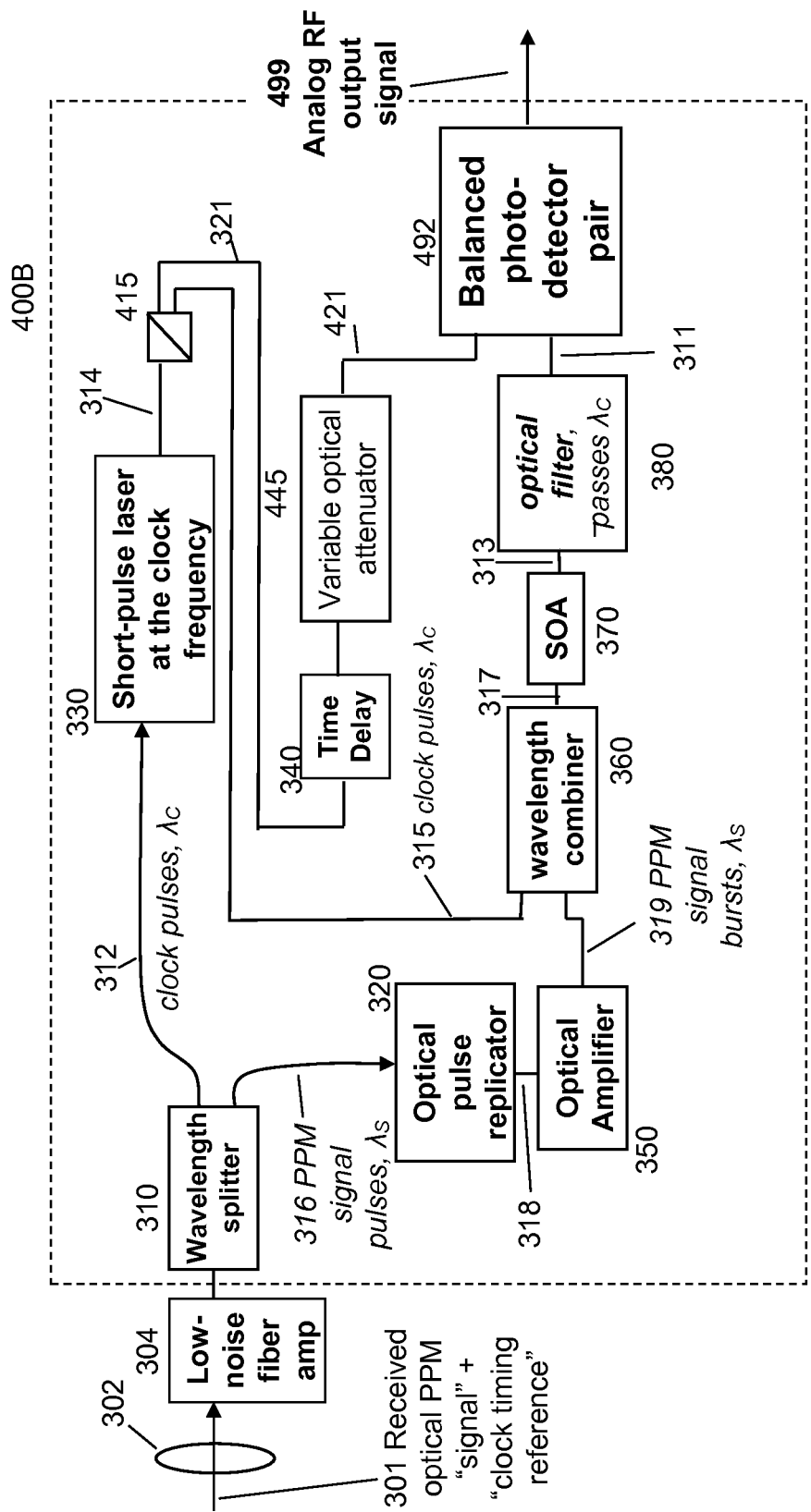
FIG. 4B illustrates another alternative embodiment of an optical analog pulse position modulation Demodulator.

In an alternative embodiment 400B shown in FIG. 4B the Demodulator uses a balanced photo-detector pair 492. One photo-detector of that pair 492 is connected to the filtered optical output 311 of the SOA 370. The other photo-detector of the pair 492 is connected to the output 421 of the variable optical attenuator 445. The output 421 is split from the normalized clock pulse 314 of the short pulse generating laser 330. The light in the paths to both photo-detectors in 492 originate from the same short pulse generating laser 330, hence noise in the short pulse generating laser 330 may be cancelled out. The adjustable optical attenuator 445 may be used to balance the average photo-detected currents. In this way, only the intensity modulation of the amplified clock pulses 313 will be observed in the output 499 from the balanced photo-detector pair 492. An adjustable delay 340 may also be added to equalize the overall lengths of the two paths from the normalized clock pulse 314 to the photo-detector inputs 311 and 421. By also balancing the delay paths, any low-frequency noise in the intensity of the normalized clock pulse 314 may be cancelled.

The preceding embodiments are by way of example and not limitation. Other embodiments of the principles of the invention are possible and within the contemplation of the invention. The essential function of a Demodulator embodying the principles of the invention is the use of two pulses wherein the original analog value is encoded in the time spacing of the two pulses. One pulse, the depleting pulse, is used to force the SOA 370 to a transparent condition. A second pulse, the sampling pulse, is normalized then used to sample the gain of the SOA 370. The amplified sampling pulse produced by the SOA 370 has an intensity proportional to the time spacing between the input pulse pair and hence the original analog value. Other labels may be used for the depleting and sampling pulses such as signal and clock without implying a limitation.

The various components of the Demodulators 300, 400A and 400B can be made to have optical-fiber pigtails that allow them to be connected together. In general, the gain of the SOA 370 and the injection locking function of the short-pulse laser 330 are sensitive to the polarization of the light. Thus, to more easily control the operation of the Demodulators 300, 400A, and 400B, it is preferable to use polarization maintaining fiber and polarization maintaining passive components where possible. Also, polarization controllers or adjusters as well as polarizers (polarization filters) may be added, as needed.

Figure 5:
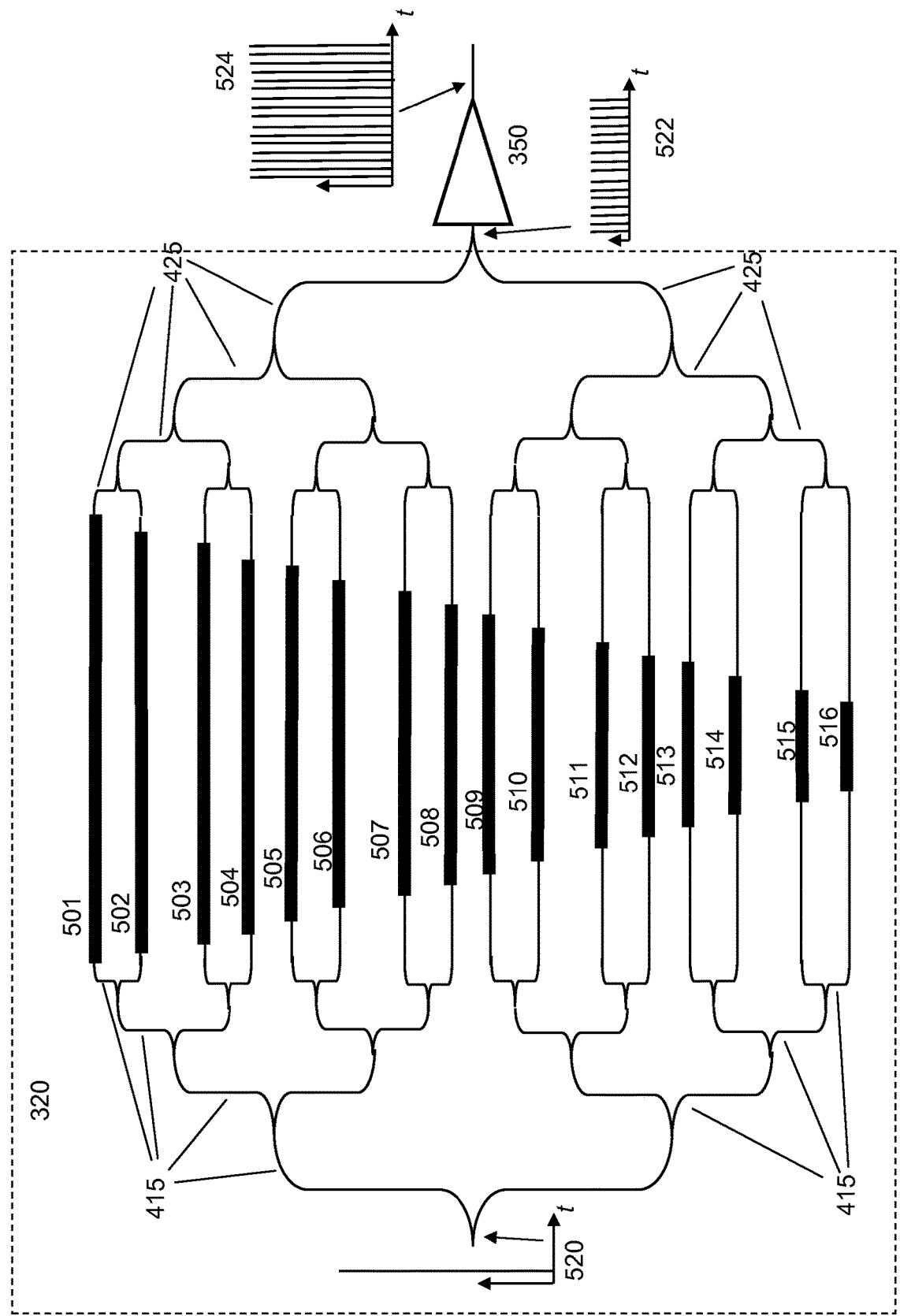
FIG. 5 illustrates an optical pulse replicator.

FIG. 5 shows one embodiment of a multi-wavelength optical pulse replicator 320 comprising power splitters 415, variable delay modules 501 through 516 and combiners 425. The combiner 425 output 522 may be amplified by optical amplifier 350 to generate the burst of signal pulses 524. The amplifier 350 may be an Erbium Doped Fiber Amplifier (EDFA), a pump/pumped laser device or similar device known in the art.

The multi-wavelength optical pulse replicator circuit 320 illustrated in FIG. 5 takes a single signal-pulse input 520 and produces a burst of signal pulses 522 having multiple copies of that signal pulse 520. FIG. 5 shows, without implying a limitation, 16 copies. Other multiples may be used and the number of copies is not limited to a multiple of two. The time-spacing between two successive pulses of the burst of signal pulses 522 should be sufficiently large that those signal pulses do not overlap. Overlap between pulses, which can have optical phase interference, could produce noise in the intensities of those pulses. However, the time-spacing also should be sufficiently small that the SOA 370 experiences minimal recovery from the gain depletion caused by one pulse of the burst of signal pulses 524 before the next pulse of the burst of signal pulses 524 arrives at the SOA 370. In this way, each successive pulse of the burst of signal pulses 524 causes the SOA 370 gain to be depleted more and more. But because the final pulse of the burst of signal pulses 524 is narrow and thus has a sharp edge, the termination of the SOA 370 gain depletion caused by the burst of signal pulses 524 is abrupt.

The multi-wavelength optical pulse replicator 320 of FIG. 5 comprises a branching network based on power splitters 415 and optical combiners 425. As illustrated in FIG. 5, this branching network comprises a tree-arrangement of 1×2 combiners 425. Ideally, since the pulses arriving at the junction of each 1×2 combiner 425 do not overlap, the combination is done without any optical interference occurring between those pulses. Instead, the combined output just suffers an insertion loss of 3 dB. As a result, the total insertion loss for an example 16-to-1 combiner, which has 4 cascaded stages of 1×2 combiners 425, would be 12 dB. The multi-wavelength optical pulse replicator 320 may have additional optical losses arising, for example, from propagation of light in waveguides 501-516, from mode-mismatches at the junctions, and from the coupling of the optical waveguides 501-516 to an optical fiber (which are at the input and output ends of the optical combiner 425 and power splitter 415). The output of the multi-wavelength optical pulse replicator 320 in the Demodulator 300 is connected to an optical amplifier 350 that increases the intensity of the multiple pulses in a burst 524. In one embodiment, this intensity of the multiple pulses in burst 524 preferably has a value comparable to or even greater than the intensity of the single input pulse 520. An erbium-doped fiber amplifier (EDFA) may be used for the optical amplifier 350, but other kinds of optical amplifiers that have similarly long gain recovery times also could be used.

The input side of the multi-wavelength optical pulse replicator 320 of FIG. 5 contains an optical-waveguide circuit that has a branching waveguide network comprised of power splitters 415 that makes multiple copies of the input pulse 520. The multi-wavelength optical pulse replicator 320 then has a set of optical delay segments 501-516 of differing length that give each of those 16 copies a different amount of time delay. The length of each delay segment 501-516 is a successively increasing multiple of a pre-determined delay increment. The multi-wavelength optical pulse replicator 320 preferably uses a longer delay increment when the input pulse is wider. In one exemplary embodiment, if the delay increment is 3 psec, the first copy of the input pulse 520 would be given an added time delay of zero psec. The second copy would be given an added time delay of 3 psec. The third copy would be given an added time delay of 6 psec; the fourth copy would be given an added time delay of 9 psec, and so on. The $16^{th}$ copy would be given an added time delay of (N-1)t, where t is the incremental time delay and N is the number of copies. For this example, that time delay of the $16^{th}$ copy would be 45 psec. The length increment is determined by the refractive index of the optical waveguided mode in the circuit. If that refractive index has a value of 1.5, the length increment would be approximately 0.6 mm. The foregoing does not imply a limitation. Other embodiments with more or fewer optical delay elements and uniform or non-uniform delay increments may be used.

FIG. 5 shows one embodiment of the multi-wavelength optical pulse replicator 320. However, the multi-wavelength optical pulse replicator 320 of FIG. 5 may be improved to increase the signal to noise ratio. With analog systems, the dynamic range and the signal to noise ratio often must be greater than many tens of dB. For real optical pulses, the edges of the pulse are not abrupt on the order of tens of dB but instead there still is significant energy even at large time values away from -3 dB power level of the pulse. Optical interference occurs in the overlapping tails of the replicated pulses that have the same wavelength and that are coherent with each other. This interference results in optical intensity variations being added by the multi-wavelength optical pulse replicator 320 like the one shown in FIG. 5. An alternative multi-wavelength optical pulse replicator 320 is shown in FIG. 6 for the Demodulator 300 that avoids this optical interference by exploiting the spectrum of wavelengths in the input to the multi-wavelength optical pulse replicator 320.

Figure 6:
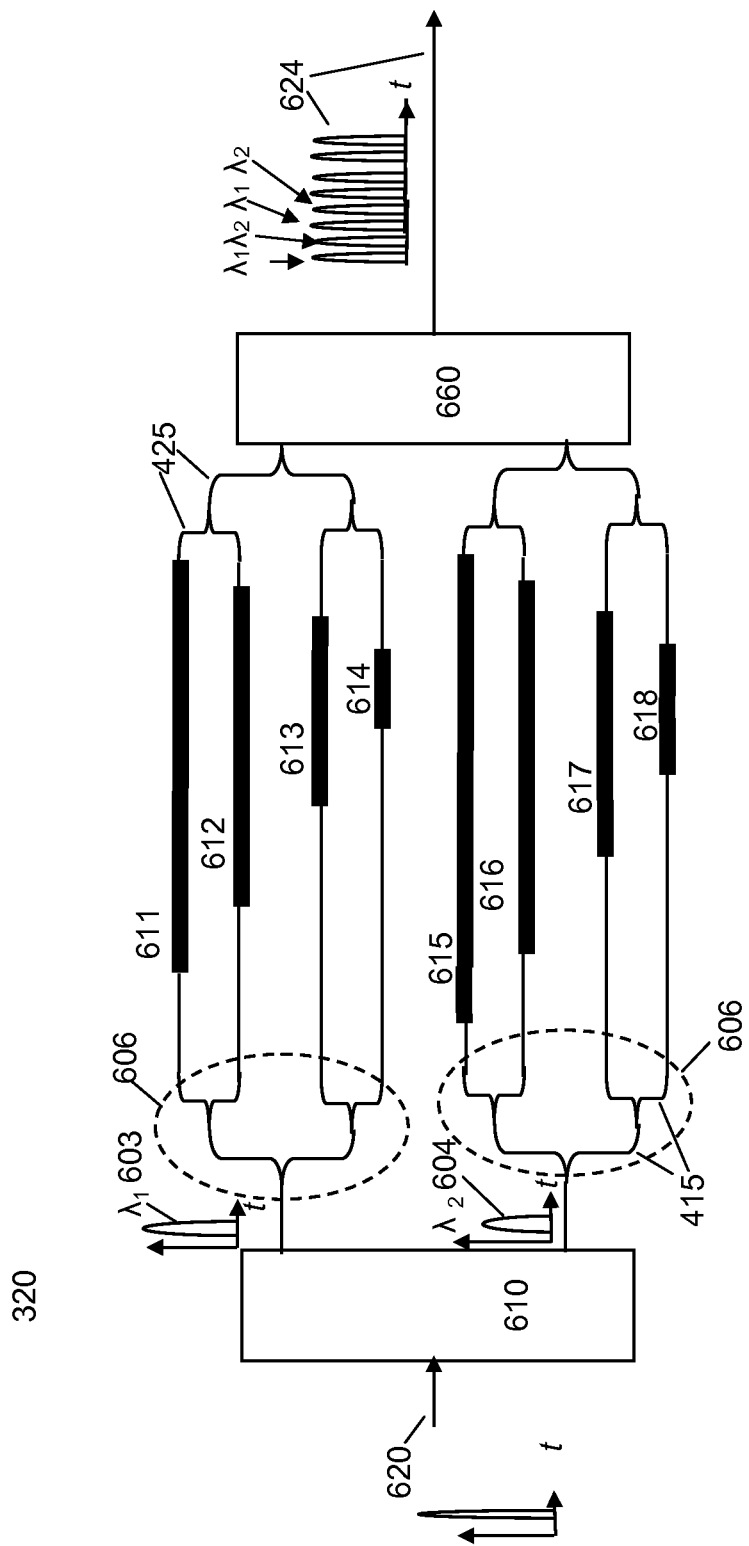
FIG. 6 illustrates a wavelength splitter combined with an optical pulse replicator.

FIG. 6 shows an alternative embodiment of the multi-wavelength optical pulse replicator 320. The pulse-position modulated output from a modulator in the transmitter generally is compressed by a subsequent wavelength shifting stage. The optical signal pulse 316 output of the wavelength splitter 310, is the input 620 to the multi-wavelength optical pulse replicator 320 in FIG. 6. The multi-wavelength optical pulse replicator 320 of FIG. 6 uses an array waveguide grating (AWG) 610 with small channel spacing (in one embodiment 1.6 nm) to carve out pulses at several different wavelengths. Each of those pulses 603 and 604 is sent to a separate pulse replicator 606 comprising one or more power splitters 415. Alternatively, the array waveguide grating 610 may be replaced with an optical wavelength splitter 310. The output of the replicators 606 are guided through optical delay segments 611-618 that have delay values chosen to avoid any overlap between the replicated pulses. The delay segments 611-618 are functionally the same as 501-516. The outputs of the optical delay segments 611-618 are then combined in combiners 425. The outputs of the combiners 425 are combined using another AWG 660. Thus, adjacent pulses in the final signal burst 624 have differing wavelengths and will not interfere with each other. Without implying a limitation, FIG. 6 shows the input 620 being decomposed into two wavelengths 603 and 604. A person skilled in the art will appreciate that the input 620 may be decomposed into a plurality of wavelengths according to the principals described herein.

Figure 7:
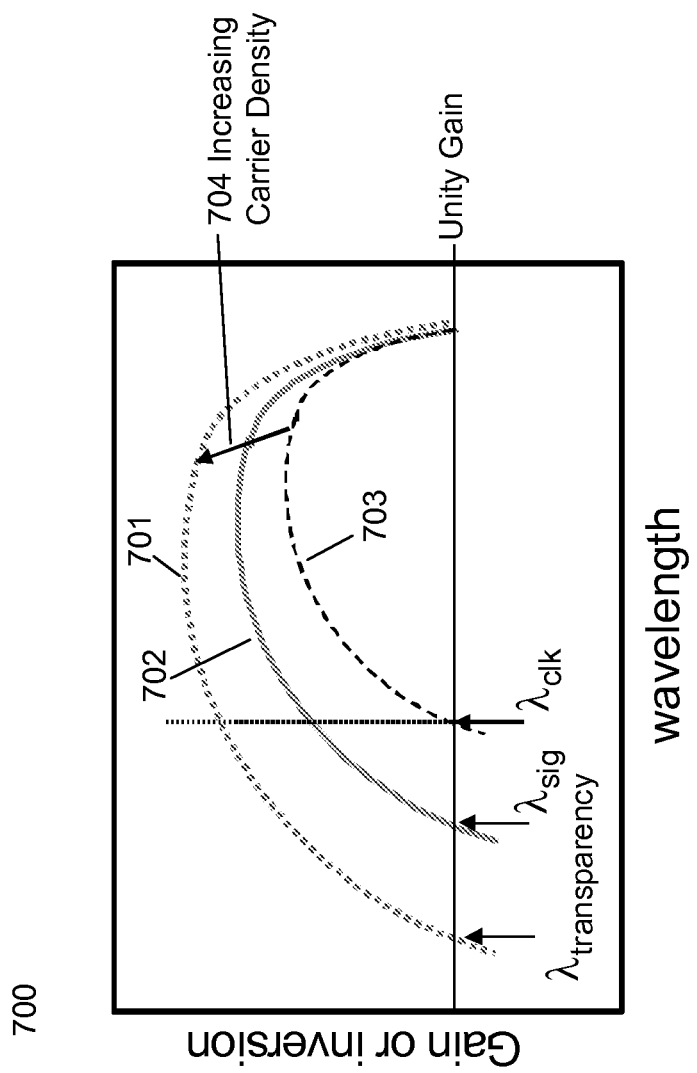
FIG. 7 illustrates a typical SOA gain spectra versus wavelength as a function of the bias current applied to the SOA.

Successful performance of the embodiments of the invention depend on operating the SOA 370 at preferred wavelengths and with a preferred bias current. FIG. 7 illustrates the gain of a typical SOA 370 as a function of wavelength for a particular bias current as it experiences first a gain depleting signal pulse 319 then the clock pulse 315. FIG. 7 is illustrative only and not of a specific device. Curve 701 shows the SOA 370 gain when both the signal pulse 319 and the clock pulse 315 are not supplied to the SOA. This gain distribution is determined by the bias current level. Curve 702 shows the SOA 370 gain after depletion by the signal pulse 319. As indicated by the arrow 704, the SOA 370 gain shifts up and toward the shorter wavelengths as the bias current replenishes the carriers. The SOA 370 bias current and the plurality of signal pulses 319 wavelength are chosen such that the energy of the plurality of signal pulses 319 is sufficient to substantially bring the SOA 370 to a transparency condition for that wavelength, where transparency is defined as the output power equals the input power. In this way, any higher level of the plurality of signal pulses 319 energy will result in absorption of the signal light and thus generation of additional carriers to maintain that transparency condition. As a result, any fluctuations in the intensity of the plurality of signal pulses 319 will not cause a fluctuation in the SOA 370 gain if the SOA 370 is at its transparency point for that plurality of signal pulse 319 wavelength. When the plurality of signal pulses 319 ends, the SOA 370 gradually returns to the gain spectrum 701 shown in FIG. 7. Thus, having a more intense plurality of signal pulses 319 would allow a larger bias current for the SOA 370. For the larger bias current, there would be a larger swing in the gain of the SOA 370 after the plurality of signal pulses 319 has ended. The larger swing in the gain of the SOA 370 results in a larger swing in the amplification of the subsequent clock signal.

As noted previously, to achieve full depletion of the gain, in one preferred embodiment, the wavelength of the plurality of signal pulses 319 is matched with the bias-current dependent gain spectrum of the SOA 370, as illustrated in FIG. 7. The SOA 370 has a material transparency wavelength, $\lambda_{transparency}$, that is set by the level of the bias current. Light at shorter wavelengths (higher photon energy) than $\lambda_{transparency}$ experience net absorption and generate electrical carriers that supplement the carriers injected by the bias current. Light at longer wavelengths than $\lambda_{transparency}$ experience net positive gain and deplete the electrical carrier population in the SOA 370, because of the stimulated emission. The curve 702 represents the quasi-equilibrium gain spectrum resulting from gain-depletion by a long signal pulse 319 (or pulse burst) whose wavelength is longer than $\lambda_{transparency}$. A sufficiently long and intense plurality of signal pulses 319 can establish a new transparency condition such that the SOA 370 now becomes transparent for the wavelength $\lambda_{sig}$ of the plurality of signal pulse 319. After the plurality of signal pulses 319 ends, the gain spectrum gradually shifts back toward the curve 701 as additional electrical carriers are supplied to the SOA 370 via the bias current. In addition, the transparency condition reverts back toward its original value with transparency occurring at the $\lambda_{transparency}$ and no longer at $\lambda_{sig}$. The curve 703 represents the gain spectrum of the SOA 370 after the SOA 370 is depleted by a strong and sufficiently long clock pulse 315 at the clock wavelength $\lambda_{clk}$, which is longer than the wavelength $\lambda_{sig}$ of the plurality of signal pulse 319. The SOA 370 gain spectrum gradually shifts again back to the curve 701 after each clock pulse 315 has ended.

The typical SOA 370 gain spectrum in FIG. 7 shows that the gain is larger for longer wavelengths of the light but the spectrum eventually has a downward curvature as the wavelength is increased. Thus, a clock pulse, or gain-probing pulse, at a longer wavelength would experience a larger time-average level of the SOA gain. However, the swing in the gain caused by the gain-depletion due to the signal burst and the gain-recovery due to the continuously supplied (DC) bias current becomes smaller and smaller as the clock wavelength is increased beyond a maximum. The amplitude of the RF output 399 (in FIG. 3) from the photo-detector 390 of the OAPPM Demodulator 300 is proportional to the swing in the SOA 370 gain. The noise on the RF output 399 is proportional to the time-average gain level. Thus, it is preferable to have the clock wavelength only slightly greater than the wavelength of the plurality of signal pulses 319, although alternative embodiments may use substantially the same wavelength for both clock pulses 315 and plurality of signal pulses 319. Typical values for the clock pulse 315 wavelength and the plurality of signal pulse 319 wavelength depend on the SOA 370 selected. For maximum RF signal output 399 from the OAPPM Demodulator 300, it is preferable to operate in the regime for which the SOA 370 gain is increasing with wavelength rather than decreasing with wavelength. These constraints guide the selection of the preferred types of SOA 370 devices to use in the OAPPM Demodulator 300. Typical SOA 370 amplifiers, by example and not to imply a limitation, are the BOA1080, BOA1004 and SOA1117 by Covega Corporation of Jessup Md.

In one aspect of the invention, the plurality of signal pulse 319 wavelength $\lambda_{sig}$ is chosen to be shorter than the clock pulse 315 wavelength $\lambda_{clk}$. Furthermore, the signal pulse wavelength $\lambda_{sig}$ and the SOA 370 bias current, are chosen to make the gain fully depleted by the plurality of signal pulses 319. In another aspect of the invention, the effective duration of the plurality of signal pulses 319 to the SOA 370 is sized so that the total optical energy producing the SOA 370 gain depletion can be increased without increasing the peak intensity of the (gain depleting) plurality of signal pulses 319.

If the plurality of signal pulses 319 has sufficient energy, it can act like a temporary "holding beam" to reset the carrier population to a new transparency wavelength that matches the wavelength $\lambda_{sig}$ of the signal pulse 319. Ideally, regardless of the gain spectrum the SOA 370 had before the plurality of plurality of signal pulses 319 arrives, that plurality of signal pulses 319 should reset the carrier population to the same level, thereby reducing the sensitivity to the plurality of signal pulses 319 variation. Also, as long as the energy of the plurality of signal pulses 319 is sufficiently large for each plurality of signal pulses 319 to temporarily establish a new transparency wavelength at $\lambda_{sig}$, the carrier population at the end of each plurality of signal pulses 319 will be at the same value, thereby reducing the sensitivity to fluctuations in the intensity of the plurality of signal pulses 319.

FIGS. 5 and 6 described previously illustrate optical pulse replicators 320 for stretching the signal pulse 316 without increasing the peak intensity of the plurality of signal pulses 319. In one preferred embodiment, the optical pulse replicator 320 effectively supplies a long signal pulse 316 in the form of a plurality of signal pulses 319 to the SOA 370, with the total energy sufficient to fully deplete the gain of the SOA 370. The long time duration of the plurality of signal pulses 319 allows the total energy of the light depleting the SOA 370 gain to be increased without making its peak power so high that the SOA 370 or the optical combiners 360 and filters 380 in the Demodulator 300 become damaged.

Figure 8:
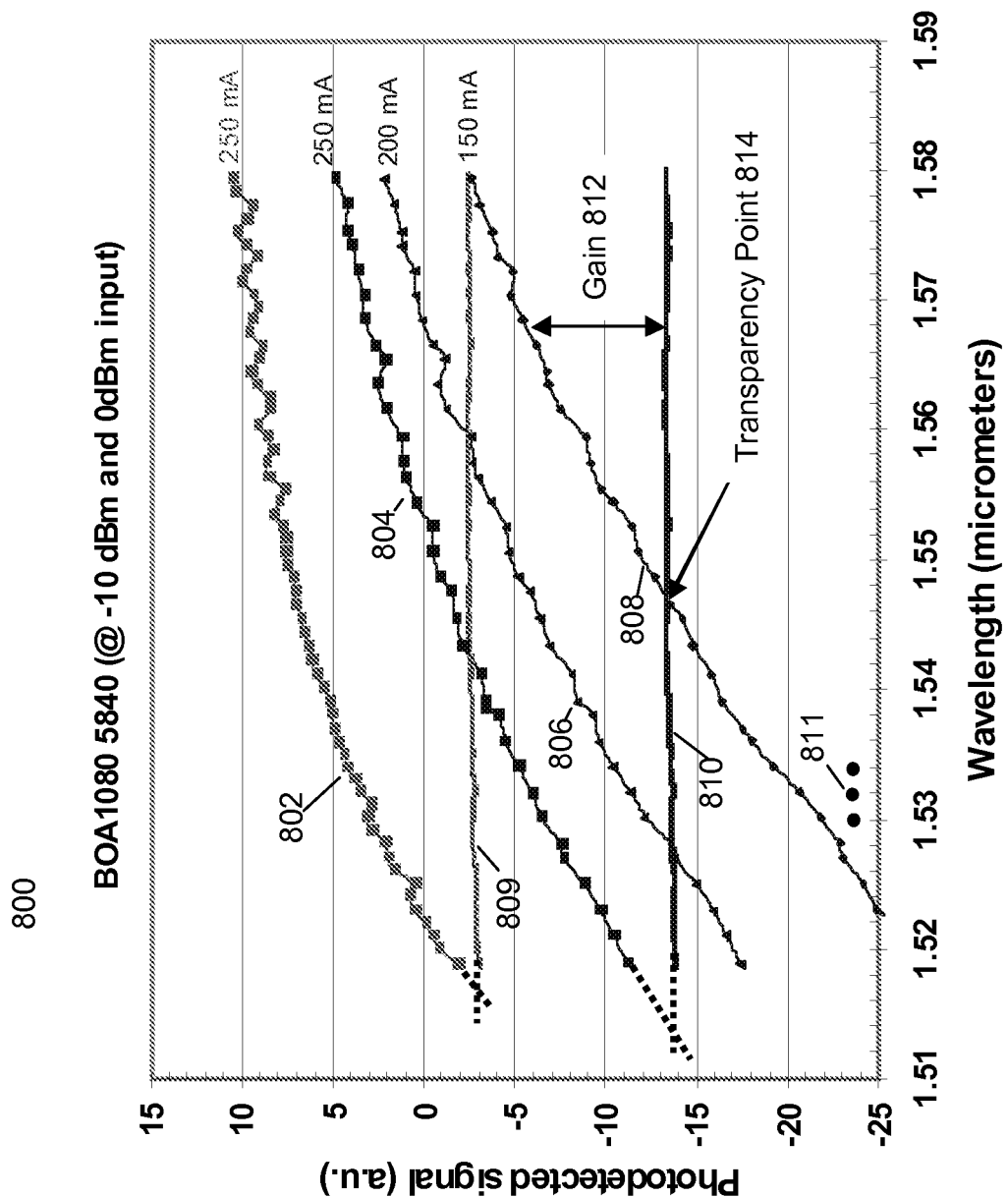
FIG. 8 illustrates the gain as a function of wavelength of an SOA measured for several different values of its bias current and for two different values of the intensity of the probe light.

Without implying a limitation, FIG. 8 shows the typical operating characteristics of an exemplary semiconductor optical amplifier (SOA) 370 used in various embodiments of the invention. The SOA 370 is the model BOA1080 by Covega Corporation of Jessup Md. FIG. 8 illustrates one aspect of the invention as selecting the wavelengths, intensity, and bias current for the SOA 370.

FIG. 8 shows the photodetected output signals 802, 804, 806 and 808 that were measured by a photodetector placed to detect the light 313 at the output from the SOA 370, for the particular SOA 370 bias current levels shown. FIG. 8 also shows the photodetected input signals 809 and 810 that were measured by a photodetector placed to detect the light 317 at the input to the SOA 370, for two different intensity levels of that input light 317. The wavelength of the continuous-wave input light 317 was tuned between 1.52 micrometers and 1.58 micrometers and the input and output light of the SOA 370 was measured at each wavelength set-point. Input 809 has an intensity level of zero dBm and output 802 corresponds to that input. Output curve 802 results from the 250*ma* bias current. Input 810 has an intensity level of −10 dBm and the corresponding output curves are 804, 806 and 808 at bias currents of 250 mA, 200 mA and 150 mA respectively. Curves 802, 804, 809 and 810 were extrapolated in FIG. 8 to facilitate the following explanations. These extrapolations are shown as dotted lines at the shorter wavelengths for curves 802, 804, 809 and 810 in FIG. 8.

The gain applied to a given SOA 370 input signal 317 at a particular wavelength is the vertical distance (dB relative scale) on the plot of FIG. 8 between an input curve 809, 810 and its associated output curve 802, 804, 806, 808 for a particular bias current to the SOA 370. The gain 812 at a wavelength of 1.568 micrometers for input 810, intensity −10 dBm, and bias current 150 mA is shown as an example. If the input curves 809, 810 are considered as indicating reference levels of zero gain, the output curves 802, 804, 806, 808 can be considered as being the gain curves of the SOA for their associated levels of input intensity and bias current. The effect of increasing the bias current is to shift the gain curves up (indicating higher gain) and to the shorter wavelengths, as shown by gain curves 804, 806 and 808. Compare the input and output curves 809 and 802, 810 and 804 for a 250 mA bias current at a wavelength of 1.54 micrometers. The photodetected output level indicated by curve 802 for −0 dBm input 809 is approximately 6 dBm for a photodetected input level of −2.5 dBm. Thus, SOA 370 input signal 317 at 1.54 micrometers and intensity level 0 dBm will receive a gain of approximately 8.5 dB for an SOA 370 bias current of 250 mA. Also, as shown by curves 810 and 804, SOA input signal 317 at 1.54 micrometers and intensity level −10 dBm will receive a gain of approximately 10 dB for an SOA bias current of 250 mA. This shows it is preferable to use lower input power signals to maximize the gain available and thereby the sensitivity of SOA 370 output to variations in input 317 timing.

Continuing with FIG. 8, the transparency point is a condition at which the input light experiences zero dB gain. This condition is established for a given SOA at particular combinations of SOA 370 bias current, input light wavelength and power level. For the −10 dBm input 810 and with a bias current of 150 mA the transparency point 814 for output curve 808 is at 1.547 micrometers. Since the Optical Analog PPM Demodulators (300, 400A, and 400B) use the SOA 370 to measure the time shift of the clock pulse 315, in one preferred embodiment, it is preferable to use a signal pulse 319 whose wavelength is shorter than the wavelength of the clock pulse 315. In this way, even if the gain for the signal pulse 319 is zero dB, the gain for the clock pulse 315 will have a value greater than one (>0 dB) and the clock pulse 315 will be amplified by the SOA 370. In one preferred embodiment, the wavelength of the signal pulse 319, the wavelength of the clock pulse 315, and the SOA 370 bias current are chosen so the wavelength of the signal pulse 319 is at or near the SOA 370 transparency point. Moreover, the wavelength of the clock pulse 315 is chosen to be longer than the signal pulse 319 wavelength yet shorter than the wavelength for the maximum gain. In addition, the power level of the signal pulse 319 may be chosen to ensure the signal pulse 319 experiences minimal gain. Likewise the clock pulse 315 power may be chosen to experience maximum amplification. Alternatively, the clock pulse 315 power may be chosen to maximally deplete the gain of the SOA.

Further continuing with FIG. 8, the transparency point for −10 dBm input level and 250 mA bias current is approximately at a wavelength of 1.514 micrometers, as indicated by an extrapolation of curves 804 and 810. If the input level is increased to 0 dBm level, for the same 250 mA bias current, the transparency point would shift to a longer wavelength of 1.518 micrometers, as indicated by an extrapolation of curves 802 and 809. Thus, if an input signal 317 at a wavelength of 1.514 micrometers has its intensity increase from a level of −10 dBm to a level of 0 dBm, that input signal 317 would experience negative gain (in dB) and the light would be absorbed instead by the SOA 370, thereby augmenting the gain of the SOA 370. The photo-generated carriers from the absorption of that light supplement the carriers supplied by the bias current and act to shift the gain curve up (higher gain) and toward shorter wavelengths (i.e., away from the gain curve associated with 804 and toward the gain curve associated with 802).

Alternatively, if an input signal 317 at a wavelength of 1.518 micrometers has its intensity decrease from a level of 0 dBm to a level of −10 dBm, that input signal 317 would experience positive gain (in dB) and the light would be amplified by the SOA 370. The amplification process depletes the carriers in the SOA 370 and acts to shift the gain curve downward (lower gain) and toward longer wavelengths (i.e., away from the gain curve associated with 802 and 804 and toward the gain curve associated with 804 and 810). These examples illustrate the selection of the SOA 370 bias current, wavelength of input signal 317, and the power level or intensity of input signal 317 to be at or near a transparency point. Any increase of the input signal 317 power level or intensity would result in absorption of that excess signal power to restore the transparency condition and any decrease of the input signal 317 power level or intensity would result in amplification of the input signal 317, accompanied by depletion of the SOA 370 gain, until the transparency condition is reached again. Considering the examples above, if the input signal 317 has a wavelength of 1.512 micrometers and a minimum intensity of −10 dBm, for an SOA bias current of 250 mA, any fluctuation of the intensity of the input signal 317 between the levels of −10 dBm and 0 dBm should not result in a net change of the SOA gain. Now consider an input signal pulse 317 that has a wavelength of 1.512 micrometers and an intensity of at least −10 dBm and an SOA 370 biased at a current of 250 mA, if the duration of that input signal 317 is sufficiently long, the SOA will reach a transparency condition such that any fluctuations in the intensity of that input signal 317 will not further change the gain of SOA 370 while that input signal 317 continues to be supplied to the SOA. A more intense input signal 317 can reach the transparency condition in a shorter time whereas a less intense input signal 317 will reach the transparency condition in a relatively longer time.

Now, consider an input signal 317 that has energy between the wavelengths of 1.530 and 1.534 micrometers (as illustrated by dotted line 811), still referring to FIG. 8. Suppose the intensity of that input signal 317 can fluctuate between −10 dBm and 0 dBm. The bias current of the SOA 370 would preferably be set at 200 mA to have that signal pulse always reach the transparency condition by depleting the gain with a sufficiently long input signal 317. However, if the bias current of the SOA 370 were set at 250 mA or at 150 mA, the intensity of that input signal 317 may not always be sufficiently high to produce a transparency condition. Note that the transparency condition might be reached by absorbing or by amplifying that input signal 317 depending on its wavelength and input power.

The preceding paragraph discussed setting the characteristics of the input signal 317 and the SOA 370 bias current to facilitate depleting the gain of the SOA 370 and setting the characteristics of the clock pulse 315 so as to maximize the change in gain experienced by the clock pulse 315. The same discussion applies to any signal intended to deplete the carriers of the SOA 370 and any signal intended to experience the gain of the SOA 370. The labels "signal pulse" and "clock pulse" do not imply a limitation that only a pulse derived from the optical clock pulse 312 may experience the gain of the SOA 370. In an alternate embodiment, the signal pulse 316 may be coupled to the short pulse laser 330 and optical clock pulse 312 may be coupled to the optical pulse replicator 320.

The pulse intensity noise (or amplitude jitter) of the optical signal pulse 316 will affect the link SNR and is addressed in part by the operation of the SOA 370 described in connection to FIG. 8. Pulse timing jitter of the received optical signal pulse 316 and optical clock pulse 312 will also affect the link SNR. To mitigate the effects of the pulse-to-pulse timing jitter, the optical signal pulse 316 and the optical clock pulse 312 are preferably handled as matched pairs of those pulses. The time delay 340 acts to make the clock pulse 315 of a pair always be the one that immediately follows the plurality of signal pulse 319 of that same pair. To address the pulse intensity noise of optical clock pulses 312, the Demodulators 300 and 400B may include a short-pulse generating laser 330 that is synchronized to the optical clock pulses 312. The short pulse generating laser 330 may be implemented in one or more configurations 900a, 900b, 1000 and 1100 shown in FIGS. 9a, 9b, 10 and 11. Functionally, the devices 900a, 900b, 1000 and 1100 normalize the input optical clock pulse 312 in intensity, time and spectrum. Where the reference numbers used in FIGS. 9a, 9b, 1000 and 1100 are the same in the least two significant digits indicates the same signal or component.

The pulse-position modulator in the transmitter of an OAPPM link may contain a mode-locked laser source that generates a train of optical pulses. Each of those pulses samples the RF signal input to that transmitter and has their pulse position modulated according to the sampled voltage of that RF input signal. The OAPPM transmitter can be configured to transmit not only the pulse-position modulated pulses but also a set of timing-reference pulses as groups of two-pulse pairs. One pulse in a pair is the timing-reference pulse and the other pulse in that pair is the position-modulated pulse. If the timing reference pulse of a pair is derived from the same sampling pulse that was supplied to the modulator and that became the position-modulated pulse of the pair, there is no relative timing jitter between those two pulses of a pair. Pulses in different pairs can have relative timing jitter but not the two pulses in the same pair. The preferred Demodulator processes the two pulses in each pair of received pulses as a pair through the adjustment of time delay 340. The preferred Demodulator uses the timing-reference pulse of a pair to control the timing of the normalized clock pulse 314 generated by the short pulse generating laser 330 in the Demodulator 300 or 400B. The preferred Demodulator uses the position-modulated optical signal pulse 316 of the same pair to deplete the gain of the SOA prior to the arrival of the corresponding optical clock pulse 312. The corresponding normalized clock pulse 314 is synchronized to the optical clock pulse 312 of that same pair. In this way, there is minimal timing jitter between the gain-depleting optical signal pulse 316 and the subsequent normalized clock pulse 314.

Figure 9A:
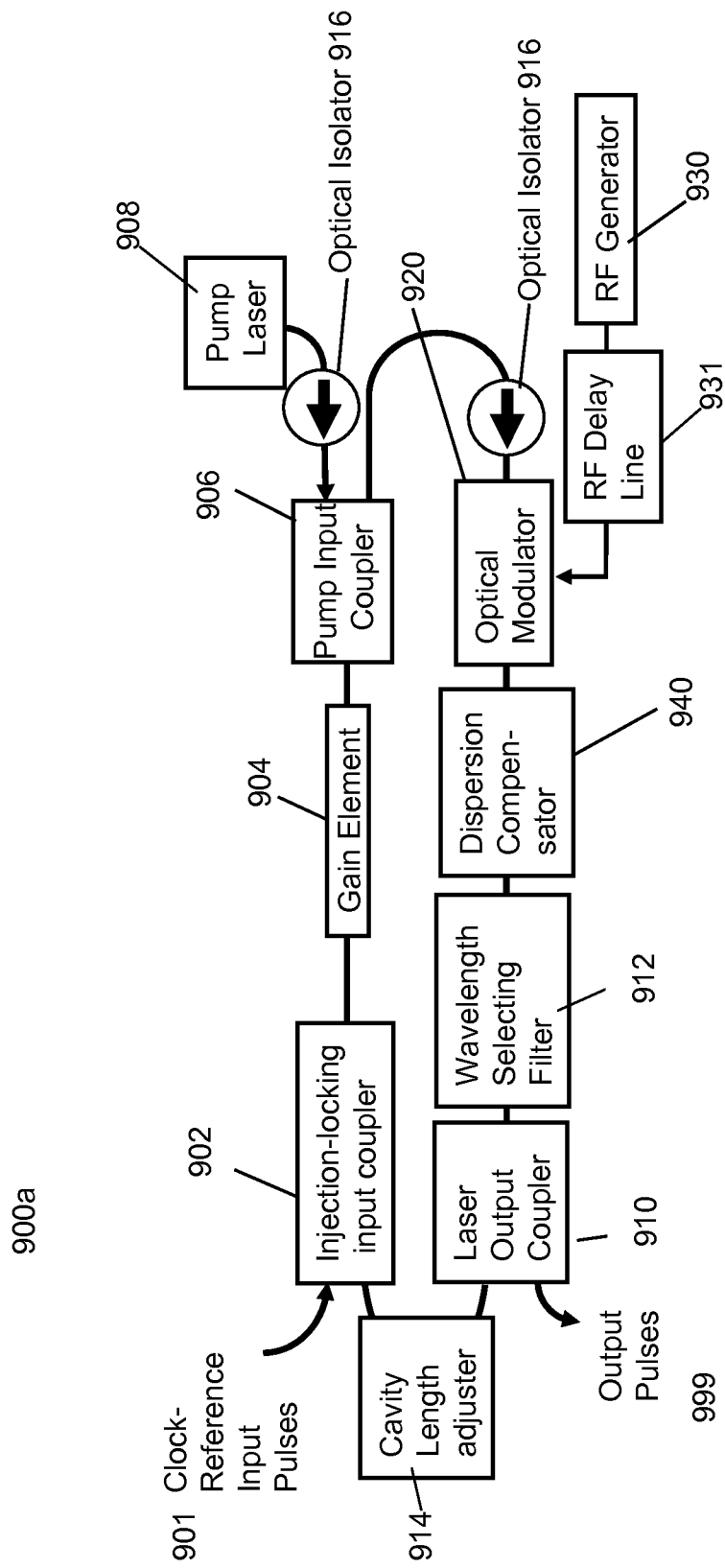
FIG. 9a illustrates one aspect of the invention as a short pulse laser clock.

The Demodulators 300 and 400B in the OAPPM receiver preferably use a short-pulse generating laser 330 that is not actively mode locked by a periodic electrical RF waveform but instead is optical-injection locked by a train of optical pulses. A block diagram of an exemplary short-pulse generating laser 330 implemented as an Optical-Injection Locked Fiber Laser 900a is shown in FIG. 9a. The Optical-Injection Locked Fiber Laser 900a has a ring cavity that includes a Gain Element segment 904, three Optical Couplers 902, 906 and 910 and an Optical Isolator 916. A first Optical Coupler 910 is used to couple laser-generated light 999 out of the cavity, and to the output of the Short-Pulse Generating Laser 330. A second Optical Coupler 902 is used to couple the Clock Reference Input Pulse 901 into the cavity. These Clock Reference Input Pulses 901 for the injection locking are obtained from the OAPPM transmitter and preferably are the optical clock pulses 312 supplied to the short-pulse generating Laser 330. In the configuration illustrated, a third Optical Coupler 906, which typically would be wavelength selective, is used to couple pump light from the Pump Laser 908 into the cavity for pumping the Gain Element 904. Since the Gain Element 904 could generate light that travels in both directions around the ring cavity, the Optical Isolator 916 selects a preferred direction for the laser light to travel around the ring cavity. The pump light from the Pump Laser 908 could be supplied to travel in either or both directions through the Gain Element 904. The Clock Reference Input Pulses 901 are coupled to travel in the same direction as the laser-generated light, clockwise in FIG. 9a. The ring cavity of the Optical-Injection Locked Fiber Laser 900a is gated by the RF Generator 930. The timing of the RF Generator 930 is adjusted with the RF Delay Line 931.

Continuing with FIG. 9a. The Gain Element 904 is pumped continuously but with the pumping level set such that the gain of the laser 900 is close to but not quite sufficient to sustain lasing. The received Clock Reference Input Pulse 901 is the input optical clock pulse 312 of the received pair 301 amplified by Low Noise Amplifier 304 and are then injected into the laser cavity through Optical Coupler 902. The Clock Reference Input Pulse 901 is sufficiently energetic such that it can further pump the Gain Element 904 to bring it above the lasing threshold. In addition, some of the photons in that Clock Reference Input Pulse 901 can stimulate emission by the Gain Element 904, with that emission being sustainable because the laser is now above the lasing threshold. The lasing light quickly depletes the available gain of the Gain Element 904 so that a short pulse 999 is obtained that is coupled out through the output coupler 910. Since the lasing is initiated by the Clock Reference Input Pulse 901, the timing of the laser output pulse 999 is synchronized with the Clock Reference Input Pulse 901. However, the intensity of the output pulse 999 is determined primarily by the average gain of the Gain Element 904 and is much less sensitive to variations in the intensity of the Clock Reference Input Pulse 901.

It may be beneficial to have a Optical-Injection Locked Fiber Laser 900a whose round trip gain is sufficient to lase only during the times the Clock Reference Input Pulse 901 are to be coupled into the Optical-Injection Locked Fiber Laser 900a. The RF Generator 930, RF Delay Line 931 and Optical Modulator 920 act to suppress lasing in the cavity except when the Clock Reference Input Pulses 901 arrive by synchronizing the Clock Reference Input Pulses 901 with the RF Generator 930. The Optical Modulator 920 acts like a shutter or gate with a time-varying optical attenuation. The Optical Modulator 920 is preferably driven at the same frequency as the pulse-repetition frequency of the Clock Reference Input Pulses 901 by the RF Generator 930. The RF Generator 930 generates a sinusoidal modulation waveform and the adjustable RF Delay Line 931 has its time delay adjusted to synchronize the Optical Modulator 920 with the arrival of the Clock Reference Input Pulses 901. The result is the Optical-Injection Locked Fiber Laser 900a has an output largely insensitive to variations in the Clock Reference Input Pulse 901.

The DC bias of this Optical Modulator 920 and the RF modulation voltage from the RF Generator 930 may be set such that the gain of the Optical-Injection Locked Fiber Laser 900a is low, because of attenuation by the Optical Modulator 920, except near the time of the arrival of the Clock Reference Input Pulse 901. This reduces the amplified spontaneous emission noise of the laser and hence the noise added to the output 999.

The Optical Filter 912 in the Optical-Injection Locked Fiber Laser 900a may be used to select the wavelength of the lasing light to match the wavelength of the Clock Reference Input Pulse 901. This Optical Filter 912 is helpful in reducing the amplified spontaneous emission coupled to the output 999 of the Optical-Injection Locked Fiber Laser 900a. The Cavity Length Adjuster 914 can be an adjustable optical delay line. For an Optical-Injection Locked Fiber Laser 900a, the output light 999 is not obtained solely by a build up of light from many passes through the laser cavity. However, in one preferred embodiment, the pulse-repetition interval of the Clock Reference Input Pulse 901 is substantially a multiple of the cavity round-trip time, which can be adjusted by the Cavity Length Adjuster 914. The Optical-Injection Locked Fiber Laser 900a also may contain a Dispersion Compensator 940 that serves to narrow the pulse duration of the emitted light. The Optical Filter 912 and the Dispersion Compensator 940 are preferably placed close to the Output Coupler 910, so that the output light 999 will have a low noise floor and a short pulse width.

Figure 9B:
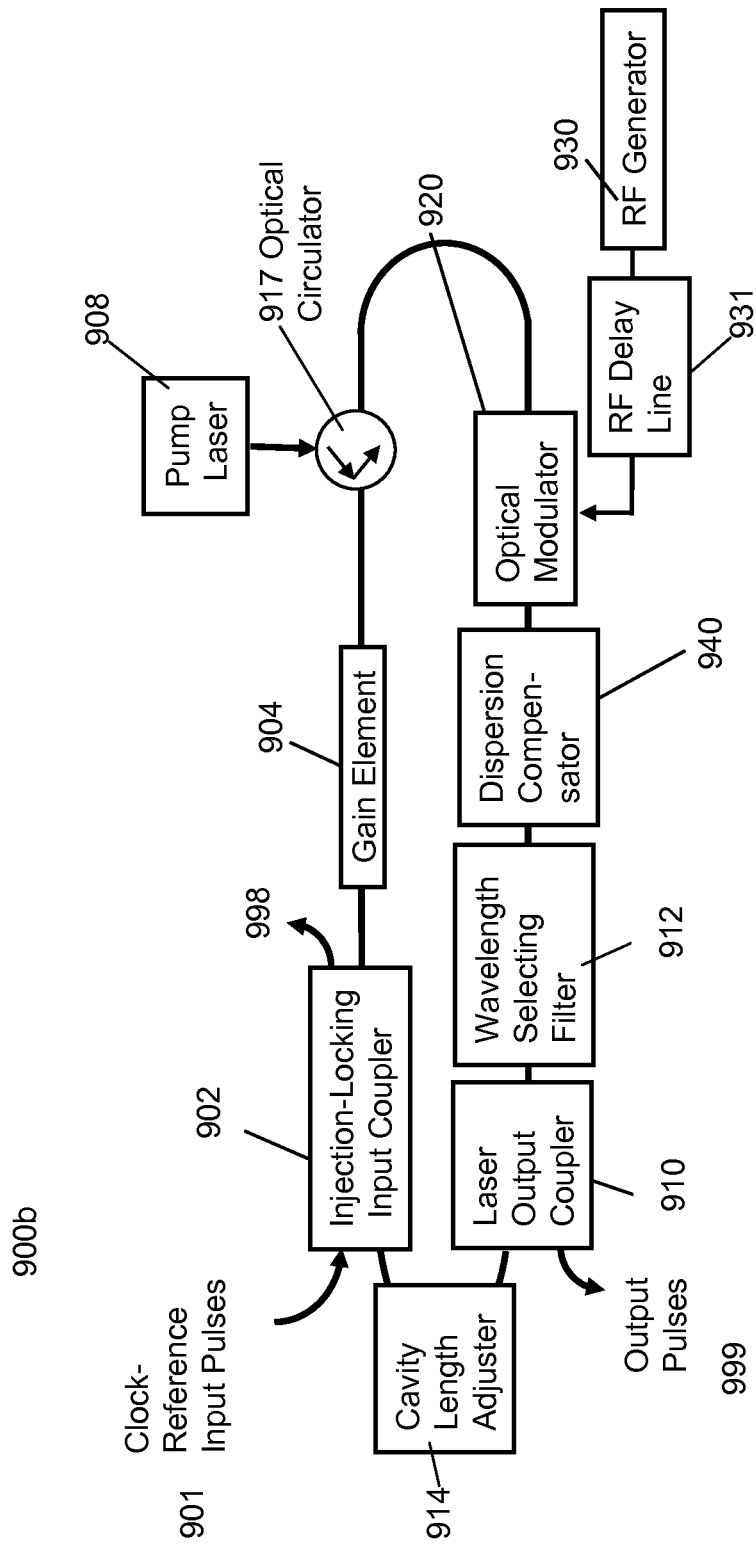
FIG. 9b illustrates one aspect of the invention as a short pulse laser clock.

A block diagram of an alternative Short-Pulse Generating Laser 330 implemented as an Optical-Injection Locked Fiber Laser is shown in FIG. 9b. The Optical-Injection Locked Fiber Laser 900b differs from the Optical-Injection Locked Fiber Laser 900a in that the Pump Input Coupler 906 is replaced with an Optical Circulator 917. Another variation shown in FIG. 9b uses the second Optical Coupler 902 to couple the Clock Reference Input Pulse 901 into the ring, and also could be used to couple a portion of both the laser-generated light as well and the Clock Reference Input Pulse 901 out of the ring as monitor pulses 998. These two sets of pulses 901 and 908 that are coupled out by the second Optical Coupler 902 can be monitored with an optical cross-correlator or other fast pulse-displaying instrument as a means to set the initial time-delay 340 in FIGS. 3 and 4B.

Figure 10:
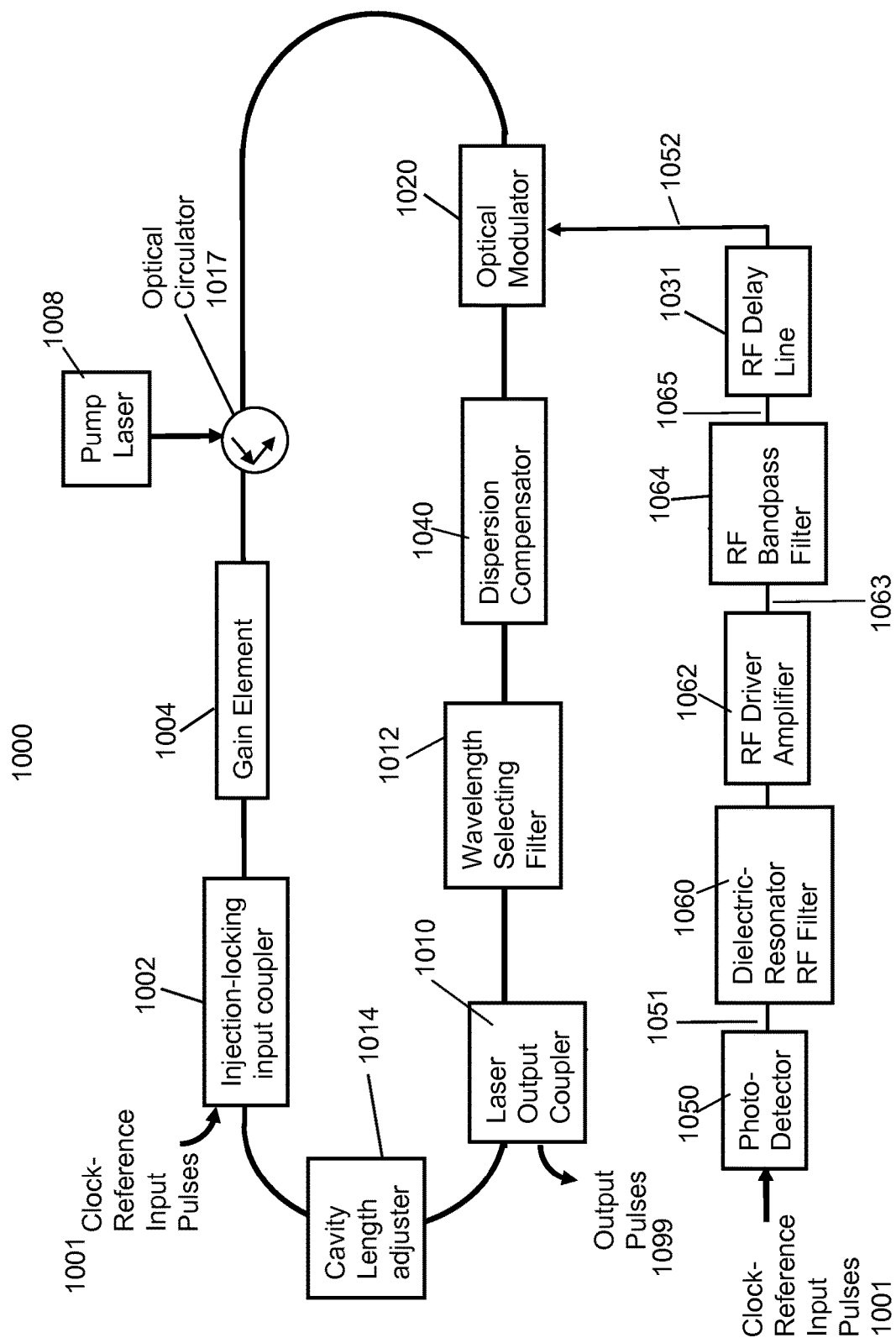
FIG. 10 illustrates another aspect of the invention as another short pulse laser clock.

A variation of the embodiment 900b is shown in FIG. 10. The RF Generator 930 is replaced with an RF Bandpass Filter 1064, a RF Driver Amplifier 1062, a Dielectric Resonator RF Filter 1060, and a Photo Detector 1050 that receives the Clock Reference Input Pulse 1001. In operation the Clock Reference Input Pulses 1001 are converted into an electrical signal 1051 by the Photo Detector 1050. The electrical signal 1051 has a frequency spectrum that decays with increasing frequency. The electrical signal 1051 passes through the Dielectric Resonator RF Filter 1060 to generate an electrical signal with a substantially uniform frequency response. The output of the Dielectric Resonator RF Filter 1060 overdrives the RF driver Amplifier 1062 to produce a squared off output in signal 1063. The signal 1063 is cleaned up by the RF Bandpass Filter 1064 to produce a Control Signal 1065. The Control Signal 1065 may be delayed by the RF Delay Line 1031 to produce the Control Signal 1052 for the Optical Modulator 1020. In this way the gating of the ring cavity in the Optical-Injection Locked Fiber Laser 1000 is controlled with a substantially square wave instead of a sinusoid.

Figure 11:
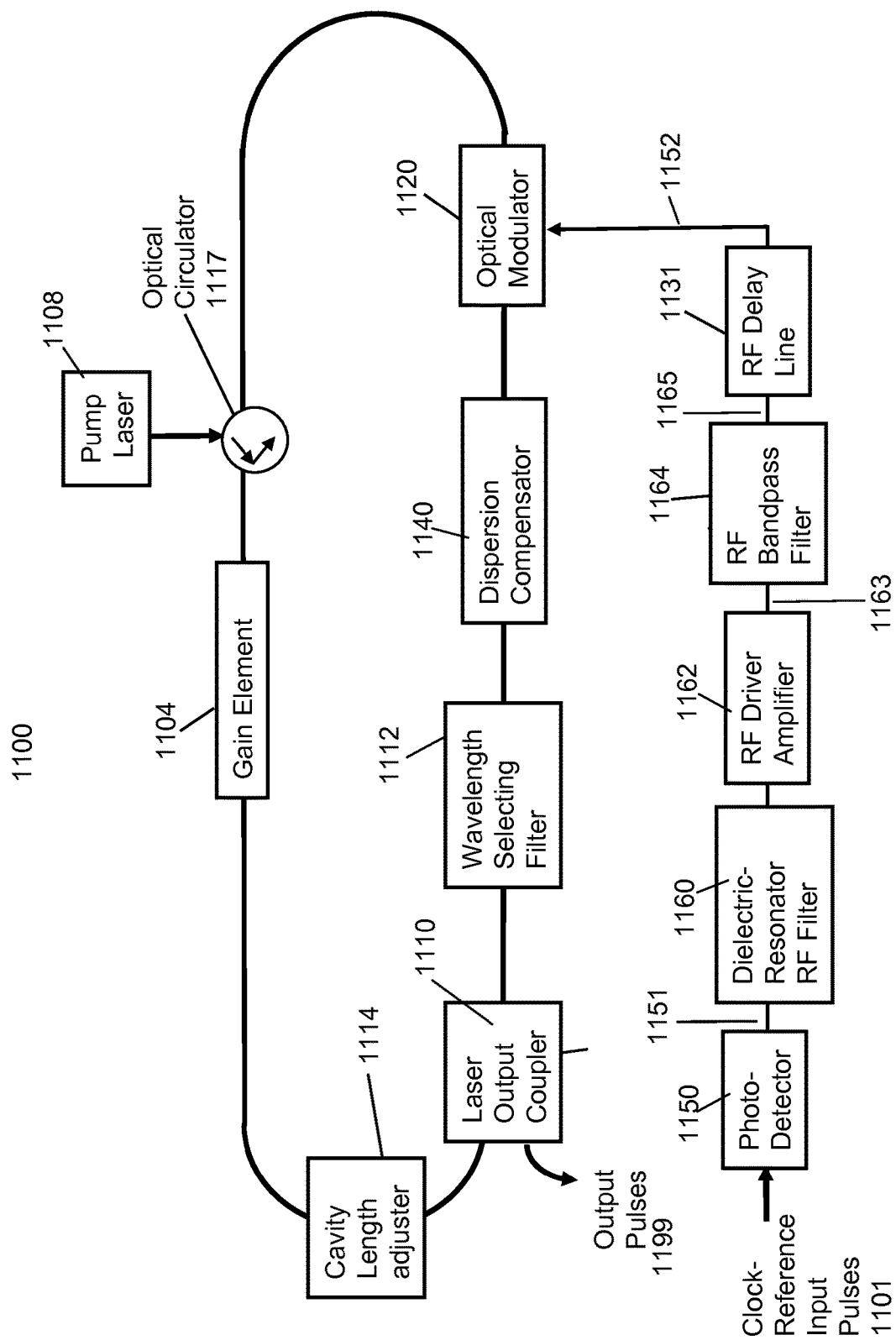
FIG. 11 shows an aspect of the invention as a short pulse laser clock.

FIG. 11 shows another aspect of this invention in a further embodiment of short-pulse generating laser 300 as an Optical-Injection Locked Fiber Laser 1100. This embodiment is substantially the same as the Optical-Injection Locked Fiber Laser 1000 except the second Optical Coupler 902 is omitted. With this embodiment, lasing of the Optical-Injection Locked Fiber Laser 1100 is further decoupled from the energy of the Clock Reference Input Pulse 1101. The last two digits of the reference numbers in FIGS. 10 and 11 are the same to identify the same components, functions and signals.

While the principles of the invention has been described in connection with certain exemplary embodiments, it is to be understood by those skilled in the art that application of the principles of the invention are not limited to the disclosed embodiments, but, on the contrary, are intended to cover various modifications included within the spirit and scope of the appended claims and equivalents thereof

The invention claimed is:

1. An optical injection-locked laser receiving an optical input pulse comprising:
    a ring cavity comprising a first optical coupler, a second optical coupler, a third optical coupler, an optical modulator, and a gain element wherein the ring cavity has a circulating laser light defining an optical path of the ring cavity;
    the first optical coupler coupling light from a pump laser into the ring cavity;
    the third optical coupler within the optical path of the ring cavity and coupling the optical input pulse into the ring cavity;
    the second optical coupler coupling a portion of the circulating laser light out of the ring cavity; and
    the optical modulator synchronized to the optical input pulse and attenuating the circulating laser light in response to an external input.

2. The optical injection-locked laser of claim 1 further comprising a photodetector detecting the optical input pulse and producing an electrical output coupled to the optical modulator.

3. The optical injection-locked laser of claim 2 wherein the electrical output from the photodetector is coupled through an RF Filter and then is coupled to the optical modulator.

4. The optical injection-locked laser of claim 1 wherein the first optical coupler is an optical circulator.

\* \* \* \* \*